United States Patent [19]

Lur et al.

[11] Patent Number: 5,449,630

[45] Date of Patent: Sep. 12, 1995

[54] METHOD FOR FABRICATING A TRENCH CAPACITOR STRUCTURE FOR DYNAMIC RANDOM ACCESS MEMORY INTEGRATED CIRCUIT

[75] Inventors: Water Lur, Taipei; Cheng-Han Huang, Hsinchu, all of Taiwan

[73] Assignee: United Microelectronics Corp., Hsin-Chu, Taiwan

[21] Appl. No.: 275,432

[22] Filed: Jul. 15, 1994

Related U.S. Application Data

[62] Division of Ser. No. 237,446, May 3, 1994.

[51] Int. Cl.⁶ .......................................... H01L 21/8242
[52] U.S. Cl. ........................................ 437/47; 437/24; 437/60; 437/927
[58] Field of Search .................... 437/24, 47, 60, 919, 437/927

[56] References Cited

U.S. PATENT DOCUMENTS

| | | | |
|---|---|---|---|
| 4,683,637 | 8/1987 | Varker et al. | 437/4 |
| 4,853,348 | 8/1989 | Tsubouchi et al. | 437/47 |
| 4,925,805 | 5/1990 | Van Ommen et al. | 437/927 |
| 5,183,775 | 2/1993 | Levy | 437/24 |

*Primary Examiner*—Chandra Chaudhari
*Attorney, Agent, or Firm*—Ladas & Parry

[57] ABSTRACT

A capacitor structure suitable for use in Dynamic Random Access Memory (DRAM) Integrated Circuit (IC) devices and its method of fabrication is disclosed. The capacitor includes a main or root trench extending vertically into the silicon substrate and at least one buried trench extending horizontally into the side wall of the main trench. The enlarged trench sidewall surface area as a result of the added buried trenches increases the total capacitance of the capacitor and it suitable for use with high density, high data volume memory devices. The buried trenches are formed by implanting oxygen or nitrogen ions into the designated depths of the silicon substrate, subsequently annealing the entire substrate at the absence of gaseous oxygen, and etching away the converted silicon dioxide or silicon nitride. The formed trench system can reduce the accumulation of the structural stress to avoid the formation of crystalline defects and obtain the resulting device with better quality.

14 Claims, 5 Drawing Sheets

METHOD FOR FABRICATING A TRENCH CAPACITOR STRUCTURE FOR DYNAMIC RANDOM ACCESS MEMORY INTEGRATED CIRCUIT

This is a divisional of co-pending application Ser. No. 08/237,446, filed May 3, 1994.

BACKGROUND OF THE INVENTION

1. Field of the Invention

This invention relates in general to a capacitor structure and, in particular, to a capacitor structure for use in dynamic random access memory integrated circuit devices and a method of fabricating the capacitor.

2. Technical Background

Dynamic random access memory (DRAM) has been a widely utilized in computer systems and is typically embodied in an integrated circuit (IC) device. Memory cells used in high capacity DRAM IC devices comprise a metal-oxide semiconductor field-effect transistors (MOSFETs), each having its gate terminal connected to a word line of the IC device. The source and drain regions of each MOSFET are connected, respectively, to a bit line of the memory IC device and to ground potential through a capacitor.

As is well known to persons skilled in this art, a capacitor is utilized for the storage of the memory content of each memory cell. The bit in question, either a one or a zero, as stored in the memory cell, is determined by whether or not the capacitor is charged or discharged. Due to the inherent nature of the DRAM design, the capacitor should possess high capacitance in order to maintain its memory content for as long a period of time as possible.

Since MOSFETs are bi-directional switches, the source and drain regions of a MOSFET in a DRAM memory cell reverse themselves during the read and write cycles, therefore, the source and drain regions are represented as source/drain regions in the description of this invention.

Conventional DRAM devices had a drawback of having a capacitor structure for each memory cell with relatively small capacitance for storing the memory contents of the cell. Basically, the capacitors are fabricated by forming field oxide layer, gate oxide layer, a first polysilicon layer, and a gate spacer oxide layer sequentially on a silicon substrate. A silicon oxide layer is then formed, a contact opening is etched at the designated source/drain region, and a second layer of polysilicon layer covers the contact opening. After this, a dielectric layer, such as NO (nitride/oxide), or ONO (oxide/nitride/oxide), is formed on the exposed surface of the second layer of polysilicon layer, and then a third layer of polysilicon layer is formed to complete the capacitor structure. Within this structure, the second polysilicon layer, the dielectric layer, and the third polysilicon layer constitute the capacitor for the memory cell. This prior art capacitor, which is referred to as a stacked capacitor structure, is described subsequently in greater detail with reference to FIGS. 1 and 2.

As is well known in this art, the capacitance of the capacitor is directly proportional to the surface area of the dielectric layer formed between the second and third polysilicon layers. The larger the surface area, the larger the capacitance. With the constant trend to make ICs which are smaller and smaller, component density is becoming greater and all components in IC devices are becoming smaller. This is true for the foregoing stacked capacitors, but making the capacitors smaller reduces their capacitance and also reduces the time during which they will store data. Additionally, a complex fabricating process is used to make such stacked capacitors, which process expensive to utilize.

To solve the problems outlined above for the conventional stacked capacitor structure, a trenched capacitor configuration was proposed which achieved higher capacitance. With the trenched capacitor configuration, two constructions are possible. On a P-type silicon substrate, a field oxide layer, a gate oxide layer, a first polysilicon layer, and N+-type source/drain regions are formed to constitute a transistor. An anisotropic etching process, such as reactive ion etching (RIE), forms a trench in the P-type silicon substrate. A dielectric layer and a second polysilicon layer are subsequently formed in the trench to constitute the capacitor. Finally an oxide layer is formed on top, and metal is plated in the contact opening to complete a memory cell unit for a DRAM memory device. Moreover, to obtain better capacitor quality, an isolation layer, a second polysilicon layer, a dielectric layer, and a third polysilicon layer are sequentially formed after the trenched capacitor is constructed.

Such trenched capacitors enjoy higher capacitance; however, due to the small size of components required in contemporary IC devices, the aspect ratio of the trench is increasing, and as it increases, it slows down the fabricating process noticeably. Moreover, the vertical trench construction induces stress in the entire silicon device, resulting inevitable crystalline defects, thereby reducing the quality of the device.

SUMMARY OF THE INVENTION

An object of the invention, therefore, is to provide a capacitor structure, and its method of fabrication, for dynamic random access memory integrated circuit devices that has high capacitance.

It is another object of the present invention to provide a capacitor structure and its method of fabrication for dynamic random access memory integrated circuit devices that is free of structural stress.

BRIEF DESCRIPTION OF THE DRAWING

The invention, together with its features and advantages are described in the following paragraphs in accordance with the preferred embodiments and the accompanied drawings, in which.

DETAILED DESCRIPTION

Figure 1:
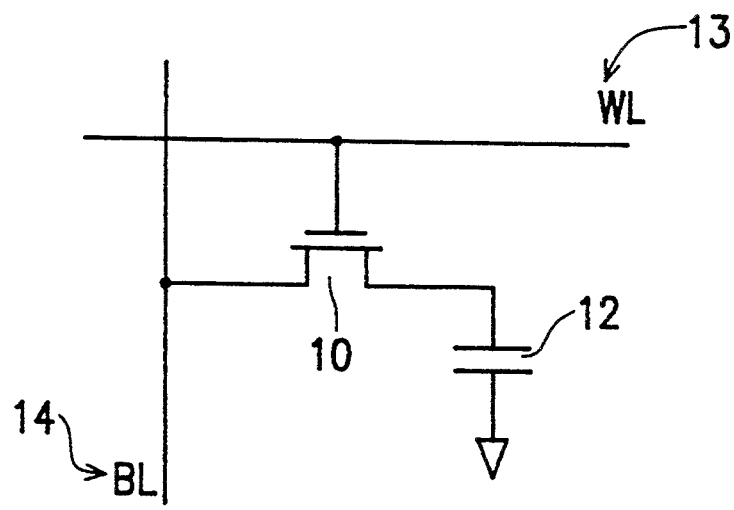
FIG. 1 is a schematic circuit diagram showing a memory cell of a DRAM device.

FIG. 1 shows a schematic diagram representation of a memory cell of the type used in Dynamic Random Access Memory (DRAM) IC devices. The memory cell for high capacity DRAM IC devices comprises a metal-oxide semiconductor field-effect transistor (MOSFET) 10, with its gate terminal connected to the word line (WL) 13 of the memory IC device. Its source and drain regions are connected, respectively, to the bit line (BL) 14 of the memory IC device and to ground potential through a capacitor 12.

Figure 2:
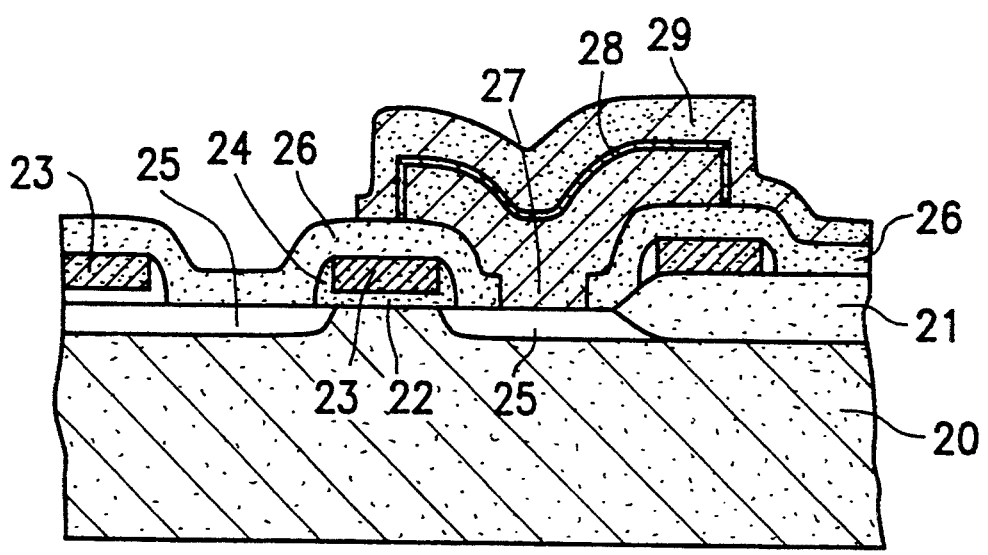
FIG. 2 is a cross sectional view of a stacked capacitor construction of a prior art memory cell in a DRAM device.

In FIG. 2, a cross sectional view of a prior art stacked capacitor structure in a DRAM memory cell is shown. The device is fabricated by forming a field oxide layer 21, a gate oxide layer 22, a first polysilicon layer 23, and a gate spacer oxide layer 24 sequentially on a silicon substrate 20. A silicon oxide ($SiO_2$) layer 26 is then formed, a contact opening is etched at a designated source/drain region 25, and a second layer 27 of polysilicon layer covers the contact opening. After this, a dielectric layer 28, such as NO (nitride/oxide), or ONO (oxide/nitride/oxide), is formed on the exposed surface of the second layer 27 of polysilicon, and then a third layer 29 of polysilicon is formed to complete the construction of the capacitor structure. Within this structure, the second polysilicon layer 27, the dielectric layer 28, and the third polysilicon layer 29 constitute the capacitor of the memory cell.

Figure 3A:
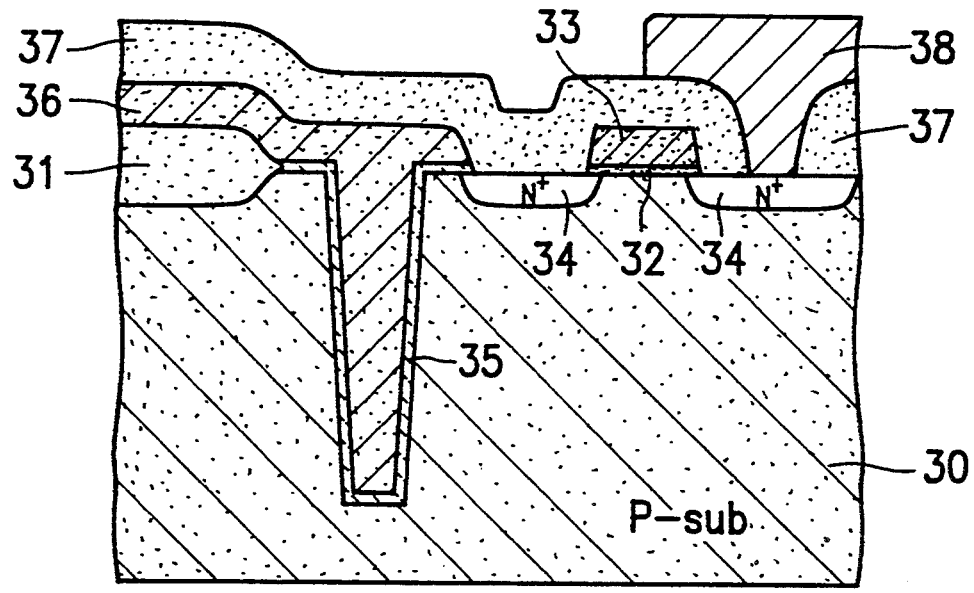
FIGS. 3A and 3B show respectively cross sectional views of two possible trenched capacitor configuration of prior art memory cell in a DRAM device.
Figure 3B:
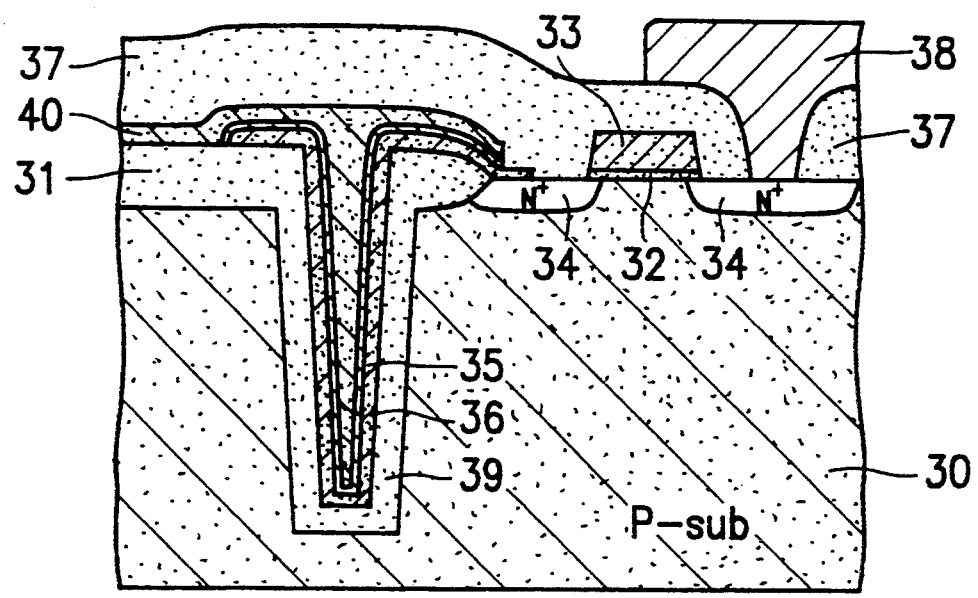

FIGS. 3A and 3B show respectively cross sectional views of two prior art trenched capacitor configurations for memory cells in DRAM devices. On a P-type silicon substrate 30, a field oxide layer 31, a gate oxide layer 32, a first polysilicon layer 33, and $N^+$-type source/drain regions 34 are formed to constitute a transistor. An anisotropic etching process, such as Reactive Ion Etching (RIE), is used to form a trench in the P-type silicon substrate. A dielectric layer 35 and a second polysilicon layer 36 are subsequently formed in the trench to constitute the capacitor. Finally an oxide layer 37 is formed on top, and a metal line 38 is formed in the contact opening to complete a memory cell unit for the DRAM memory device shown in FIG. 3A. To obtain better capacitor quality, the configuration of FIG. 3B is used where an isolation layer 39, a second polysilicon layer 36, a dielectric layer 35, and a third polysilicon layer 40 are sequentially formed after the trenched capacitor is constructed, as is shown in that figure.

Referring now to FIGS. 4A through 4D, the capacitor configuration in accordance with the present invention is exemplified in a preferred embodiment.

Figure 4A:
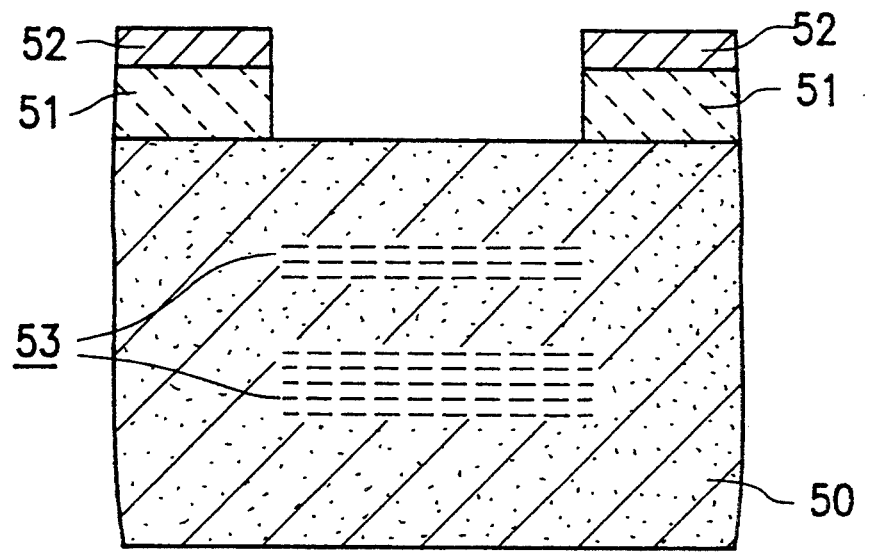
FIGS. 4A to 4D show respectively cross sectional views of a capacitor structure in accordance with the present invention in various process stages of fabrication.

In FIG. 4A, a thermal oxidation process or Chemical Vapor Deposition (CVD) process is employed to form a silicon dioxide layer 51 preferably having a thickness in the range from 5,000 to 10,000 Å on the silicon substrate 50. If desired, the silicon dioxide layer 51 can be replaced by a nitride layer deposited by chemical vapor deposition. A metal layer 52 of, for example, tungsten or the like, with a thickness preferably of 1,000 to 5,000Å is formed on the silicon dioxide layer 51 preferably using a CVD or Physical Vapor Deposition (PVD) process. In general, a titanium layer (not shown) is preferably provided between the silicon dioxide layer (or nitride layer) 51 and the tungsten layer 52 to improve adhesion between those layers.

Conventional lithography and etching techniques are then employed to pattern layers 51 and 52 as shown in FIG. 4A. The pattern is then utilized as a mask to implant oxygen or nitrogen ions to the positions 53 at designated locations and depths in the silicon substrate. The ion implantation is preferably conducted at different energy levels in order to obtain preferably two or more spaced implanted regions as is shown in FIG. 4A. The reason for using tungsten metal (or other high atomic number metal) as the mask 52 in ion implantation procedure is due to the fact that, if a high atomic number metal (such as tungsten) is not utilized for masking, the thickness of the silicon dioxide layer 51 will have to be increased to the order of 2–3 μm. Since the implantation depths of the oxygen and/or nitrogen ions in the silicon substrate are proportional to their acquired energy, the implantation energy may be adjusted to distribute the oxygen and nitrogen ions at different depths as depicted. In this preferred embodiment, the employed energies are 200 keV and 500 keV respectively, and the implantation dosages are the order of $10^{18}$ atoms/$cm^2$, and thus two distinct distribution regions 53 are therefore obtained.

Figure 4B:
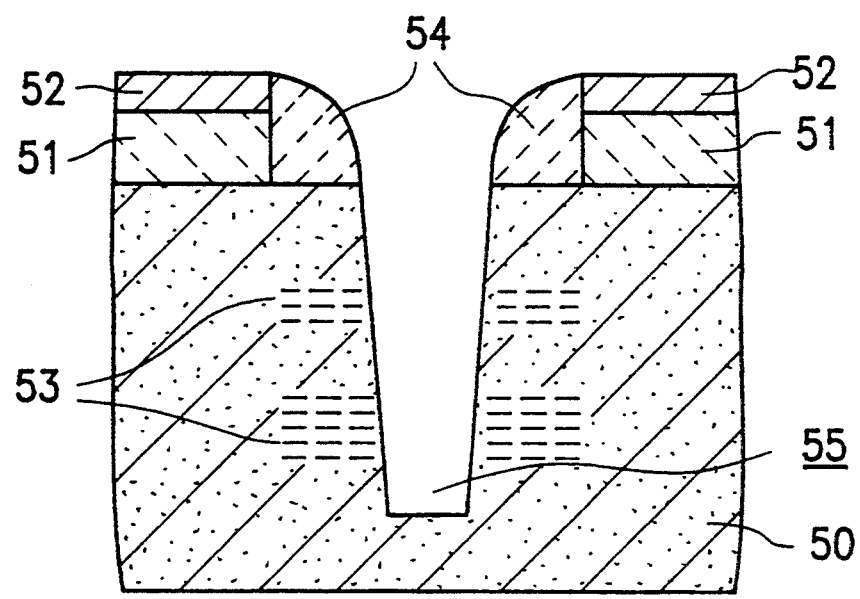

Referring now to FIG. 4B, a silicon dioxide or nitride layer 54 of thickness ranging from 3,000 to 8,000 Å is deposited on the silicon substrate 50, the silicon dioxide layer 51, and the exposed surface of the tungsten metal 52 by a CVD process. An anisotropic etching technique, such as RIE, is then employed to vertically etch into the silicon dioxide or nitride layer 54, to define a spacer layer 54 disposed on the side walls of the silicon dioxide layer 51 and tungsten metal layer 52. The spacer layer 54 is then utilized as a mask, to allow for the etching of a vertical trench 55 into the silicon substrate 50, with a depth that is deeper than the deepest depth the oxygen or nitrogen ions reached at the highest implantation energies used.

Figure 4C:
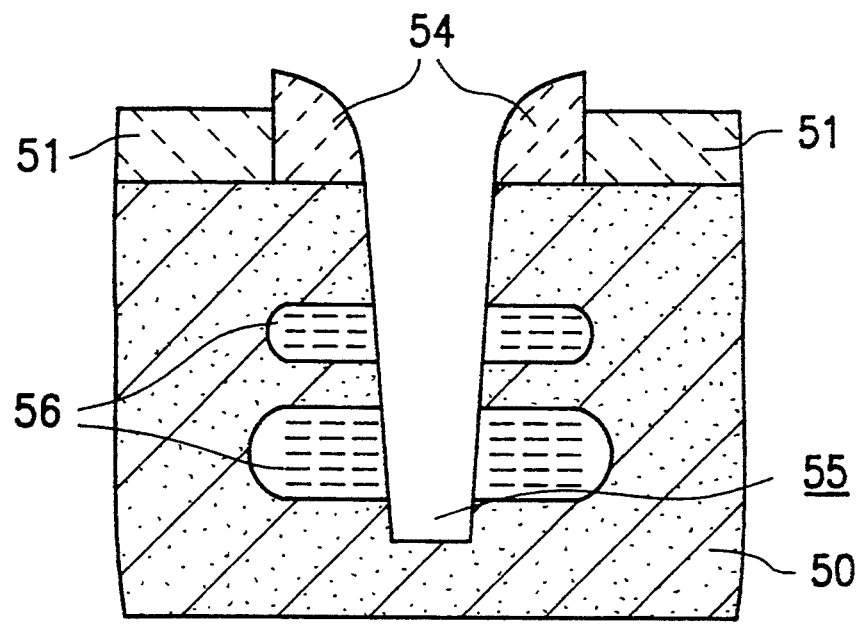

Referring now to FIG. 4C, the tungsten or other metal layer is removed using sulfuric acid, or an equivalent solution, and the wafer is annealed for 10 seconds to 30 minutes at a temperature in the range of 800° C. to 1100° C. in an oxygen-free atmosphere. The implanted oxygen or nitrogen ions react with the silicon substrate during the annealing step to form buried silicon dioxide or silicon nitride layers 56.

Figure 4D:
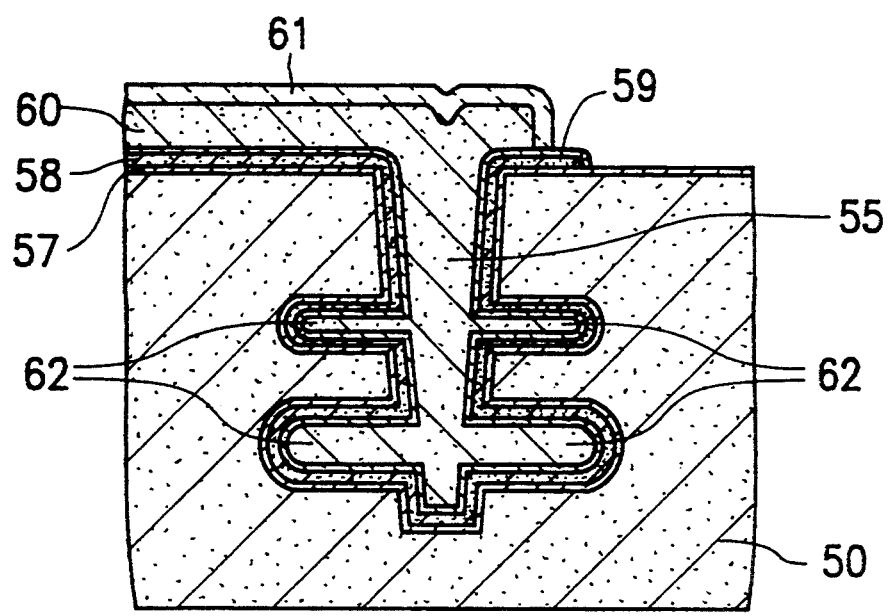

Referring now to FIG. 4D, the entire wafer is dipped in a solution containing HF or hot phosphoric acid, so that the silicon dioxide layer 51, spacer layer 54, and the buried silicon dioxide or silicon nitride layers 56 are removed. Thus buried trenches 62 are formed which are in communication with the side walls of the vertical trench 55. Together they define a buried trench system which is shown in cross section in FIG. 4D. The shape and configuration of the trench system not only increases the surface area for the capacitor device, but also effectively reduces the strain that can accumulate on the side walls of the vertical trench. With reduced stress in the structural body of the device, device defects can be greatly prevented, and results in better device quality.

A silicon dioxide layer 57, a polysilicon layer 58 and a dielectric layer 59 are deposited sequentially preferably by Chemical Vapor Deposition (CVD) on the inner surfaces of the root-shaped trench. Then, another polysilicon layer 60 is deposited by CVD to fill the root-shaped trench. Finally, another silicon dioxide layer 61 is formed to construct a complete capacitor structure in accordance with the present invention. The polysilicon layers 58 and 60 form the plates of the capacitor and they are isolated from the substrate 50 and from each other. The dielectric layer 59 may be a silicon dioxide layer, an oxide/nitride/oxide layer, a tantalum pentoxide ($Ta_2O_5$) layer, a strontium titanate ($SrTiO_3$) layer, a barium titanate ($BaTiO_3$) layer, a barium strontium titanate ($Ba_xSr_{1-x}TiO_3$) layer, or any materials having high dielectric constant. To achieve the best device function, it is preferred to use an oxide/nitride/oxide layer as the dielectric layer.

Figure 5:
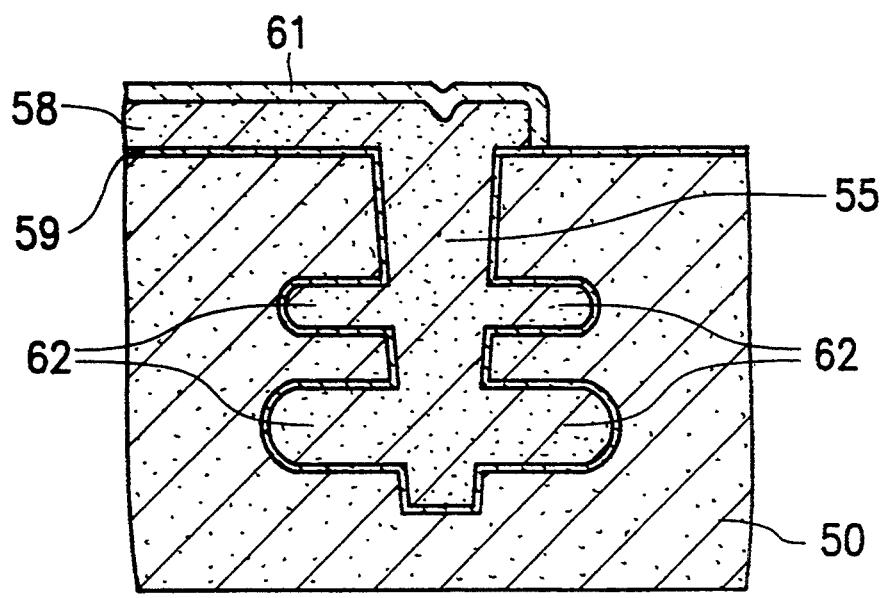
FIG. 5 depicts a cross sectional view of a second embodiment of the capacitor structure, this view being similar to that of FIG. 4D in that the process steps preceding the formation of the structure depicted in FIG. 5 are the same as in FIG. 4A-4C.

FIG. 5 depicts another embodiment of the buried capacitor. This figure is similar to FIG. 4D, but here the root-shaped trench is covered directly by a dielectric 59, and the trench is filled with polysilicon 58. The dielectric layer 59 may be a silicon dioxide layer, an oxide/nitride/oxide layer, a tantalum pentoxide ($Ta_2O_5$) layer, a strontium titanate ($SrTiO_3$) layer, a barium titanate ($BaTiO_3$) layer, a barium strontium titanate ($Ba_xSr_{1-x}TiO_3$) layer, or any materials having high dielectric constant. To achieve the best device function, it is preferred to use an oxide/nitride/oxide layer as the dielectric layer. In this embodiment, the substrate 50 forms one plate of the capacitor while polysilicon layer 58 forms the other plate.

By comparing the cross sections of the capacitor structures in accordance with the present invention as shown in FIG. 4D and/or in FIG. 5 to that of the prior art shown in FIG. 3B, it is apparent that the capacitor device of the present invention has a significantly greater surface area than that of the prior art capacitor configuration. The capacitance is therefore significantly increased. The configuration of the capacitor of the present invention is more suitable for the state-of-the-art DRAM memory devices than are prior art capacitors. The number of horizontal trenches 62 which intersect the root or vertical trench 55 can be varied, as needed, to provide the amount of capacitance desired.

What is claimed is:

1. A method for fabricating a capacitor comprising the steps of:
   (a) providing a silicon substrate;
   (b) sequentially forming a first isolation layer and a metal layer on said silicon substrate and forming a pattern in said first isolation layer and said metal layer by lithography and etching;
   (c) implanting ions into said silicon substrate by ion implantation at an energy level, said pattern layer acting as a mask;
   (d) forming a spacer layer on side walls of said first isolation layer and said metal layer to define a contact opening;
   (e) etching a first trench extending vertically into said silicon substrate using said spacer layer as a mask, wherein the depth of said trench is deeper into said silicon substrate than the maximum ion implantation depth which occurs from the energy level of step (c);
   (f) removing said metal layer;
   (g) annealing in the absence of gaseous oxygen to convert the implanted ions into a silicon compound in said substrate;
   (h) etching away said first isolation layer, said spacer layer, and said silicon compound in said silicon substrate to define at least one buried trench extending horizontally into the side walls of said first trench, said at least one buried trench and said first trench defining a trench system; and
   (i) sequentially forming a dielectric layer and a first conductive layer on the inside surface of said trench system.

2. The method of claim 1 further comprising the steps of sequentially forming a second isolation layer and a second conductive layer prior to forming the dielectric layer.

3. The method of claim 2 wherein said first isolation layer and said second isolation layers comprise silicon dioxide layers.

4. The method of claim 2 wherein said first isolation layer is a silicon nitride layer.

5. The method of claim 2 wherein said first conductive layer and said second conductive layer comprise polysilicon layers.

6. The method of claim 1 wherein said first isolation layer is a silicon dioxide layer.

7. The method of claim 6 wherein said metal layer is a tungsten layer.

8. The method of claim 1 wherein said dielectric layer is formed by first forming a silicon dioxide layer, then forming a silicon nitride layer and finally forming another silicon dioxide layer.

9. The method of claim 1 wherein said dielectric layer is a tantalum pentoxide ($Ta_2O_5$) layer.

10. The method of claim 1 wherein said dielectric layer is a strontium titanate ($SrTiO_3$) layer.

11. The method of claim 1 wherein said dielectric layer is a barium titanate ($BaTiO_3$) layer.

12. The method of claim 1 wherein said dielectric layer is barium strontium titanate ($Ba_xSr_{1-x}TiO_3$) layer.

13. The method of claim 1 wherein said ions are oxygen ions.

14. The method of claim 1 wherein said ions are nitrogen ions.

* * * * *